(12) United States Patent
Genest et al.

(10) Patent No.: US 10,709,035 B2
(45) Date of Patent: *Jul. 7, 2020

(54) RAIL CLAMP LATCH HOLDER

(71) Applicant: International Business Machines Corporation, Armonk, NY (US)

(72) Inventors: Robert R. Genest, Poughkeepsie, NY (US); Arthur Higby, Cottekill, NY (US); Leung M. Hung, Poughkeepsie, NY (US); Mateusz Koziol, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/534,536

(22) Filed: Aug. 7, 2019

(65) Prior Publication Data
US 2019/0364689 A1    Nov. 28, 2019

Related U.S. Application Data

(63) Continuation of application No. 15/891,925, filed on Feb. 8, 2018, now Pat. No. 10,448,535.

(51) Int. Cl.
*H05K 7/18* (2006.01)
*B25B 5/16* (2006.01)
(Continued)

(52) U.S. Cl.
CPC ........... *H05K 7/183* (2013.01); *A47B 88/427* (2017.01); *B25B 5/163* (2013.01); *B25B 5/166* (2013.01);
(Continued)

(58) Field of Classification Search
CPC ...... H05K 7/183; H05K 7/489; H05K 5/0217; B25B 5/163; B25B 5/166; A47B 88/426;
(Continued)

(56) References Cited

U.S. PATENT DOCUMENTS 5,489,172 A    2/1996  Michler
5,626,406 A    5/1997  Schmid
(Continued)

FOREIGN PATENT DOCUMENTS

FR    2667215 A    3/1992

OTHER PUBLICATIONS

Robert R. Genest et al.; "Rail Clamp Latch Holder", U.S. Appl. No. 15/891,925, filed Feb. 8, 2018.
(Continued)

*Primary Examiner* — Andrew M Roersma
(74) *Attorney, Agent, or Firm* — Cantor Colburn LLP; Tihon Poltavets

(57) ABSTRACT

A rail clamp latch holder is provided. The rail clamp latch holder includes a grippable portion and a rail portion disposed at a forward side of the grippable portion. The rail portion includes first and second pairs of opposed latches which are configured to latch onto a rail and which are disposed at first and second longitudinal ends of the rail portion, respectively, a tab, a locking pin and an elastic member. The tab is insertable into a rail latch. The elastic member extends along a longitudinal axis of the rail portion and elastically couples the locking pin and the tab.

18 Claims, 6 Drawing Sheets

(51) Int. Cl.
  *H05K 7/14*   (2006.01)
  *H05K 5/02*   (2006.01)
  *A47B 88/42*   (2017.01)
  *G06F 1/18*   (2006.01)
  *A47B 88/427*   (2017.01)

(52) U.S. Cl.
  CPC ............. *G06F 1/18* (2013.01); *H05K 5/0217* (2013.01); *H05K 7/1489* (2013.01)

(58) Field of Classification Search
  CPC ............. A47B 88/0418; A47B 88/427; A47B 88/0422
  See application file for complete search history.

(56) References Cited

U.S. PATENT DOCUMENTS

| | | | |
|---|---|---|---|
| 5,725,324 | A | 3/1998 | Pavelski |
| 6,373,707 | B1 | 4/2002 | Hutchins |
| 6,626,300 | B2 | 9/2003 | Kaminski et al. |
| 7,526,171 | B2 | 4/2009 | Caveney et al. |
| 7,661,778 | B2 * | 2/2010 | Yang .................... H05K 7/1489 312/333 |
| 7,850,369 | B2 * | 12/2010 | Young ................... A47B 88/427 384/18 |
| 7,967,399 | B1 * | 6/2011 | Baiza ................... A47B 88/427 312/223.1 |
| 8,366,217 | B1 | 2/2013 | Chen et al. |
| 8,787,023 | B2 | 7/2014 | Lewis, II et al. |
| 9,557,782 | B2 | 1/2017 | Hsu |
| 10,448,535 | B2 * | 10/2019 | Genest ................. H05K 5/0217 |
| 2009/0294621 | A1 | 12/2009 | Yu et al. |
| 2013/0044416 | A1 | 2/2013 | Fan |
| 2016/0262539 | A1 * | 9/2016 | Chen .................... H05K 7/1489 |
| 2016/0363965 | A1 * | 12/2016 | Hsu .......................... G06F 1/182 |
| 2019/0246515 | A1 * | 8/2019 | Genest ................. A47B 88/427 |

OTHER PUBLICATIONS

List of IBM Patents or Patent Applications Treated as Related; (Appendix P), Filed Aug. 7, 2019, 2 pages.

* cited by examiner

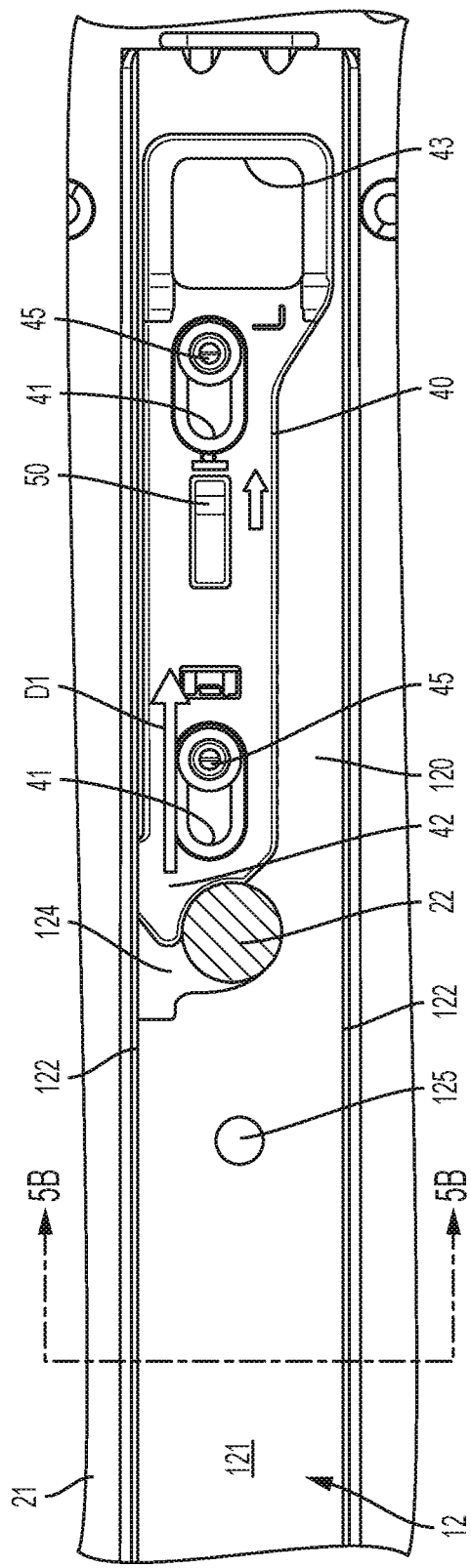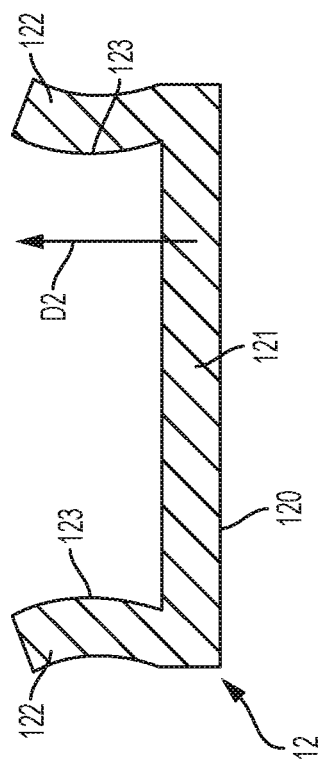
FIG. 5A
FIG. 5B

RAIL CLAMP LATCH HOLDER

CROSS-REFERENCE TO RELATED APPLICATIONS

This application is a continuation application of U.S. application Ser. No. 15/891,925, titled "RAIL CLAMP LATCH HOLDER", which was filed on Feb. 8, 2018. The entire contents of U.S. application Ser. No. 15/891,925 are incorporated here by reference.

BACKGROUND

The disclosure relates generally to a rail clamp latch holder that can be used to keep a latch open during processor drawer removal from an equipment chassis.

A processor drawer is a component of a computing device that can be installed in and removed from a chassis. The processor drawer might include multiple processing units that may be but do not need to be related to one another and a body with outwardly facing bosses. The chassis is defined to provide for a space into which the body of the processor drawer is disposable and includes sidewalls at opposite sides of the space with rails. The rails can run along lengths of the sidewalls and include grooves, in which the outwardly facing bosses of the processor drawer body are receivable, and latches. The latches can be disposed in closed positions whereby the latches prevent withdrawal of the bosses from the grooves and open positions whereby the latches permit withdrawal of the bosses from the grooves.

SUMMARY

According to one or more embodiments, a rail clamp latch holder is provided. The rail clamp latch holder includes a grippable portion and a rail portion disposed at a forward side of the grippable portion. The rail portion includes first and second pairs of opposed latches which are configured to latch onto a rail and which are disposed at first and second longitudinal ends of the rail portion, respectively, a tab, a locking pin and an elastic member. The tab is insertable into a rail latch. The elastic member extends along a longitudinal axis of the rail portion and elastically couples the locking pin and the tab.

According to one or more embodiments, a rail system is provided. The rail system includes a chassis, rails and a rail clamp latch holder. The chassis defines a space into and from which a processor drawer including bosses is installable and removable. The rails are coupled to the chassis and include a body defining a groove into which a corresponding boss is receivable, a rail latch and an elastic element. The rail latch is translatable relative to the body to assume and move between a closed position at which the rail latch prevents boss movement relative to the groove and an open position at which the rail latch permits boss movement relative to the groove. The elastic element is disposed to urge the rail latch toward the closed position. The rail clamp latch holder is attachable to each of the rails and configured to move and maintain a corresponding rail latch into and in the open position.

According to one or more embodiments, a processor drawer manipulation method is provided. The method includes press-fitting a rail clamp latch holder onto a rail of a chassis. The press-fitting includes inserting a tab of the rail clamp latch holder into a rail latch and elastically urging a locking pin of the rail clamp latch holder against the rail. The method further includes sliding the rail clamp latch holder along the rail such that the tab urges the rail latch to translate toward an open position in opposition to a bias applied thereto and continuing the sliding until the locking pin reaches a rail through-hole into which the locking pin is elastically urged such that the rail latch is maintained in the open position in opposition to the bias applied thereto.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5A is a side view of a rail of a chassis in accordance with embodiments;

FIG. 5B is a cross-sectional view of the rail of the chassis taken along line 5B-5B of FIG. 5A;

Figure 1:
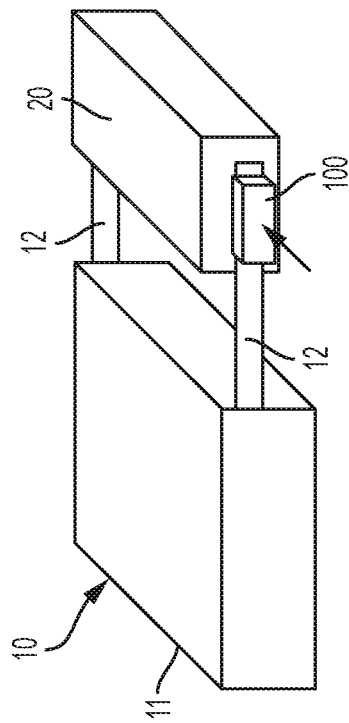
FIG. 1 is a side schematic illustration of an initial stage of a processor drawer removal operation in accordance with embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost

DETAILED DESCRIPTION

For an equipment chassis and a processor drawer that is installable in and removable from the equipment chassis, the latches of the rails of the equipment chassis are normally biased toward remaining in the closed positions. As a result of this bias, during processor drawer removal, the latches have to be urged toward the open positions in opposition to the bias and held in the open position pending boss withdrawal from the grooves. This can be difficult especially when multiple latches need to be held open for a given processor drawer. For example, in the case of a processor drawer removal in which four latches need to be held open, two individuals might be needed to operate the latches so that one or more other individuals can lift the processor drawer out of the chassis.

In view of the above, embodiments disclosed herein may include a rail clamp latch holder for keeping a latch open during processor drawer removal from an equipment chassis. The rail clamp latch holder latches on ball bearing slide rails that locks a corresponding locking latch of a rail in the open position. When each locking latch is held open in this manner, processor drawer installation or uninstallation/removal is permitted. The rail clamp latch holder includes a member with a pushing tab at a first end thereof, a first latch on a first side thereof and a second latch on a second side thereof. The member further includes a first side protector on the first side and a second side protector on the second side. The first side protector and the second side protector protrude from a top surface of the first member. The member also includes a side slot, a safety ejection angled surface for facilitating ejection of a processor drawer, a locking pin, and a locking pin spring lever.

Turning now to FIGS. 1-4, a rail system 10 for use with a computing device or a rackmount, for example, is provided. The rail system 10 includes a chassis 11, rails 12 and rail clamp latch holders 100. The chassis 11 may be a rigid or semi-rigid structural element with a bottom surface, sidewalls extending upwardly from the bottom surface and a lid. The bottom surface, the sidewalls, and the lid are configured to define an interior space 110 (see FIG. 1) in which one or more computing elements can be provided. At least one of the sidewalls and the lid may be removable to allow for operator access to the interior space 110. The rails 12 may be provided as first and second rails 12 and may be coupled to opposite sidewalls of the chassis 11. The coupling between the rails 12 and the sidewalls may be provided such that the rails 12 can be extended outwardly from the interior space 110 and retracted back into the interior space 110.

A processor drawer 20 can be a volumetric body including an exterior structure 21 (see FIG. 1) that is formed to define an interior in which electrical and processing elements are provided. The processor drawer 20 is sized to fit between the rails 12 and can further include bosses 22 (see FIG. 4) that can engage with the rails 12 such that the processor drawer 20 can be supported by and on the rails 12. In this way, with the rails 12 being extendable outwardly from the interior space 110 and retracted back into the interior space 110, the processor drawer 20 can be installed in and removed from the interior space 110 when the processor drawer 20 is supported by and on the rails 12.

Figure 2:
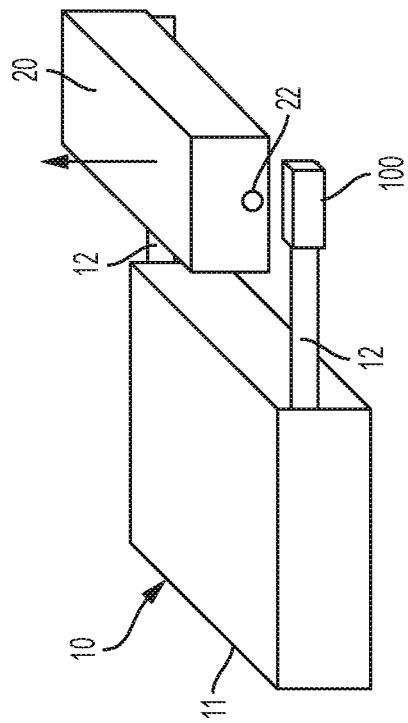
FIG. 2 is a side schematic illustration of an intermediate stage of a processor drawer removal operation in accordance with embodiments.
Figure 3:
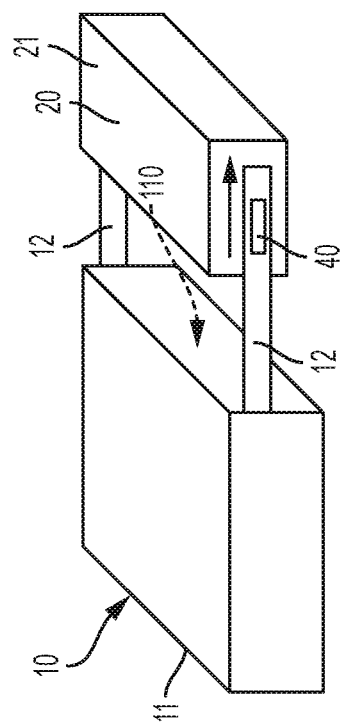
FIG. 3 is a side schematic illustration of another intermediate stage of a processor drawer removal operation in accordance with embodiments.
Figure 4:
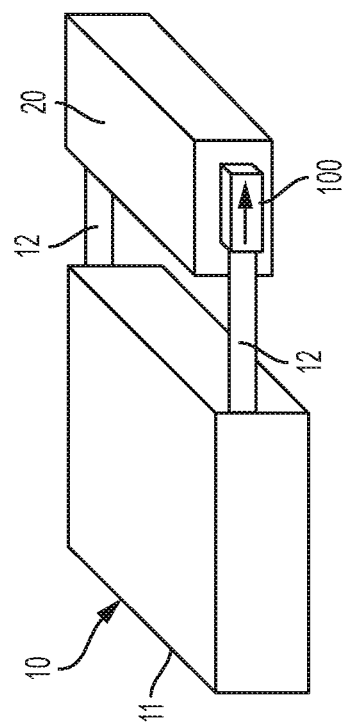
FIG. 4 is a side schematic illustration of a late stage of a processor drawer removal operation in accordance with embodiments.

That is, as shown in FIGS. 1 and 2, at an initial stage of a removal operation for the processor drawer 20 from the interior space 110 of the chassis 11 removal, the processor drawer 20 and the rails 12 are pulled outwardly from the interior space 110. Subsequently, as shown in FIGS. 2 and 3, rail clamp latch holders 100 are attached to the rails 12 and employed by an operator to cause rail latches 40 of each of the rails 12 to translate toward and then remain in open positions. At this point, as shown in FIG. 4, the bosses 22 can be raised out of the rails 12 as the processor drawer 20 is lifted upwardly off of the rails 12 thus completing the removal operation.

It is to be understood that the removal operation described above can similarly be conducted as an installation operation of the processor drawer 20. In this case, at an initial stage of the installation operation, the "empty" rails 12 may already be outside of the chassis 11 or are pulled outwardly from the interior space 110. Subsequently, the rail clamp latch holders 100 are attached to the rails 12 and employed by an operator to cause rail latches 40 to translate toward and then remain in the open positions. At this point, the bosses 22 can be lowered into the rails 12 as the processor drawer 20 is similarly lowered into the rails 12. The rails 12 and the processor drawer 20 can then be installed into the interior space 110 of the chassis thus completing the installation operation.

It is to be understood that, in certain embodiments which will be described below, while the rail clamp latch holders 100 are usable for facilitating the removal operation, the installation operation can be completed without the rail clamp latch holders 100.

With reference to FIGS. 5A and 5B, the rails 12 are coupled to the chassis 11 such that the rails 12 are capable of being extended outwardly from and retracted back into the interior space 110 of the chassis 11. As shown in FIGS. 5A and 5B, the rails 12 include a body 120 which is elongate in the extraction-retraction direction D1. The body 120 includes a planar base 121 and opposed sidewalls 122 that extend outwardly in a same lateral direction D2 from the planar base 121. In accordance with embodiments, the opposed sidewalls 122 can have an inward or outward curvature 123. At or near a distal end of each rail 12, the body 120 is formed to define a groove 124 into which a corresponding boss 22 is receivable and a rail through-hole 125. The groove 124 can have a relatively large mouth opening and a relatively narrow base. The groove 124 may also extend partially into a proximal section of the upper one of the opposed sidewalls 122 (see FIG. 8). The rail through-hole 125 can be disposed proximate to and, in some cases, inboard of the groove 124.

At or near the distal end of each rail 12, each rail 12 further includes the rail latch 40, rail latch bosses 45 and an elastic element 50. The rail latch 40 is formed to define translation guides 41 and includes a locking portion 42 and a tab receiving portion 43. The translation guides 41 are receptive to the rail latch bosses 45 such that the rail latch 40 is attached to the rail 12 and translatable along the planar base 121 in the extraction-retraction direction D1. The translation guides 41 and the rail latch bosses 45 are configured such that the rail latch 40 can assume and move between a closed position and an open position. In the closed position, the rail latch 40 prevents movement of the boss 22 relative to the groove 124 (i.e., in the closed position, the rail latch 40 interferes with a raising of the boss 22 out of the groove 124 and the rail 12). In the open position, the rail latch 40 permits movement of the boss 22 relative to the groove 124 (i.e., in the open position, the rail latch 40 does not interfere with a raising of the boss 22 out of the groove 124 and the rail 12).

The elastic element 50 biases the rail latch 40 toward normally assuming the closed position. As such, for a removal operation of a processor drawer 20 to be completed, the rail latch 40 needs to be translated toward the open position in opposition to the bias applied thereto by the elastic element 50 and then maintained in the open position in opposition to the bias applied thereto by the elastic element 50.

The locking portion 42 is configured to extend across a surface of the boss 22 when the boss 22 is disposed in the groove 124 and the rail latch 40 is disposed in the closed position. To this end, the locking portion 42 may include a lip that extends across a portion of the boss 22 with, in some cases, a curvature that is similar to that of the boss 22. In accordance with embodiments, an upper side of the locking portion 42 can be angled such that, during a lowering of the processor drawer 20 onto the rails 12, the bosses 22 can engage with the upper side of the locking portion 42 and thereby urge the rail latch 40 toward the open position. The tab receiving portion 43 may be disposed at an end of the rail latch 40 which is opposite the locking portion 42 and can be configured as a hook or u-shaped feature.

Figure 6:
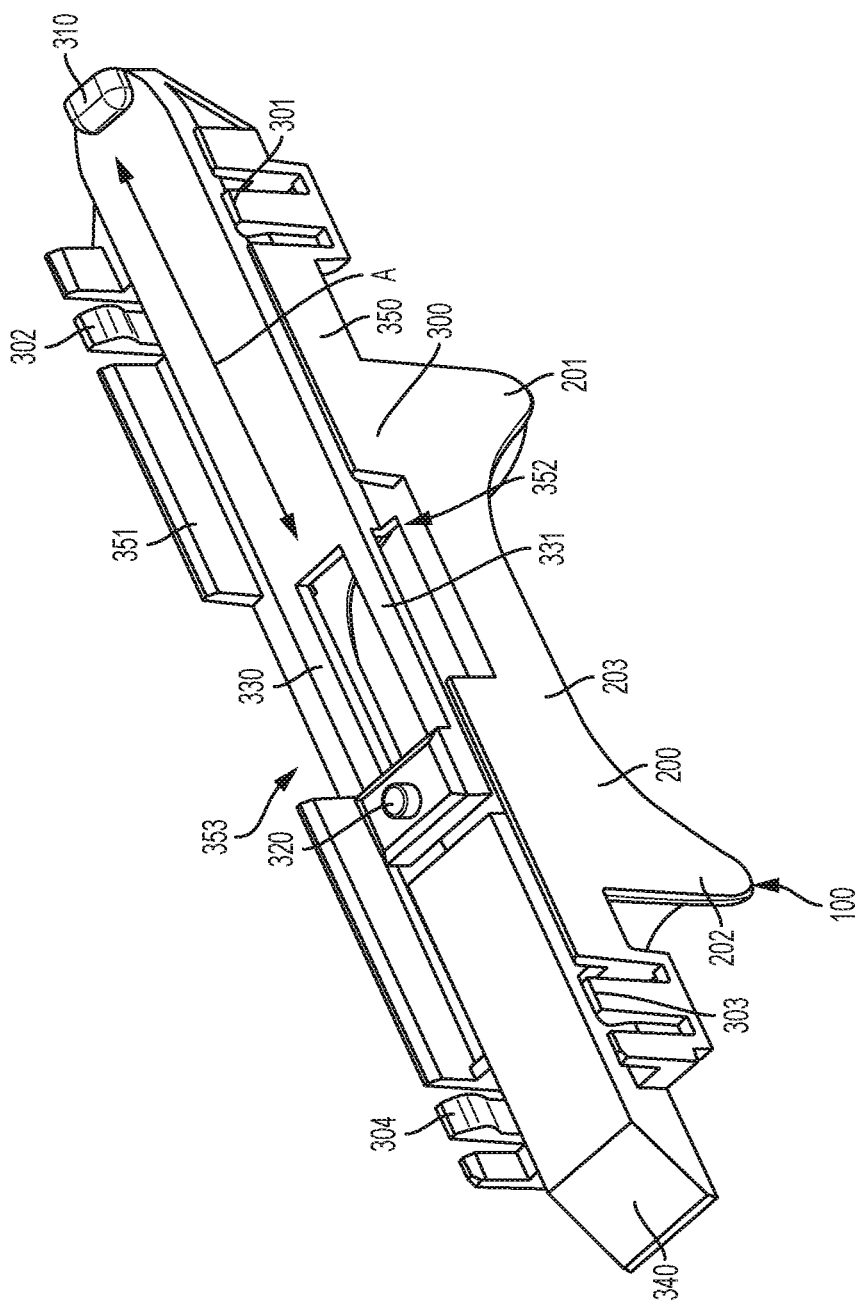
FIG. 6 is a perspective view of a rail clamp latch holder in accordance with embodiments.

With reference to FIG. 6, each rail clamp latch holder 100 is attachable to each of the rails 12 and configured to move a corresponding rail latch 40 into the open position and to maintain the corresponding rail latch 40 in the open position. As shown in FIG. 6, the rail clamp latch holder 100 includes a grippable portion 200 and a rail portion 300. The grippable portion 200 can include first and second opposed grips 201 and 202 as well as opposed sidewalls 203 extending between corresponding edges of the first and second opposed grips 201 and 202. In accordance with embodiments, the first and second opposed grips 201 and 202 can be curved and thus shaped to fit with opposed fingers of an operator. The rail portion 300 is disposed at a forward side of the grippable portion 200 such that, as the operator positions the rail clamp latch holder 100 near to a rail 12 for operational purposes, the rail portion 300 leads the grippable portion 200.

The rail portion 300 extends along a longitudinal axis A which is parallel to the extraction-retraction direction D1 during operations of the rail clamp latch holder 100. The rail portion 300 includes a first pair of opposed latches 301 and 302 and a second pair of opposed latches 303 and 304. The first pair of opposed latches 301 and 302 are configured to latch onto the opposed sidewalls 122 and are disposed at a first longitudinal end of the rail portion 300. The second pair of opposed latches 303 and 304 are configured to latch onto the opposed sidewalls 122 and are disposed at a second longitudinal end of the rail portion 300.

The distal ends of the first pair of the opposed latches 301 and 302 and the second pair of the opposed latches 303 and 304 can have bulbous features which can engage with the curvature of the opposed sidewalls 122. Thus, with the opposed sidewalls 122 and the first and second pairs of the opposed latches 301, 302, 303 and 304 being at least slightly deformable or compliant, the first and second pairs of the opposed latches 301, 302, 303 and 304 and thus the rail clamp latch holder 100 can be press-fit onto the sidewalls 122 and thus the rail 12. Moreover, since the sidewalls 122 are elongate in the extraction-retraction direction D1, the first and second pairs of the opposed latches 301, 302, 303 and 304 can slide along the sidewalls 122. Thus, the rail clamp latch holder 100 can slide relative to the rail 12.

The rail portion 300 further includes a tab 310, a locking pin 320 and an elastic member 330. The tab 310 can be inserted into the tab receiving portion 43 of the corresponding rail latch 40 when the first and second pairs of the opposed latches 301, 302, 303 and 304 are press-fit onto the sidewalls 122. The locking pin 320 is receivable in the rail through-hole 125 of the rail 12. The elastic member 330 extends along the longitudinal axis A and can be provided as a lever or leaf spring 331 which elastically couples the locking pin 320 and the tab 310 and which biases the locking pin 320 into the rail through-hole 125 when the locking pin 320 and the rail through-hole 125 are aligned.

The rail portion 300 also includes an angled surface 340 and opposed protective elements 350 and 351. The angled surface 340 is angled away from the rail 12 when the rail clamp latch holder 100 is press-fit onto the rail 12. The tab 310 and the angled surface 340 are disposed at the first and second longitudinal ends of the rail portion 300, respectively. The protective elements 350 and 351 can be provided as wings on either side of the rail portion 300 and are slidable along the opposed sidewalls 122 of the rail 12. The protective elements 350 and 351 can each be formed to define opposed slots 352 and 353, respectively, which allow for movement of the bosses 22 relative to the rail clamp latch holder 100.

Figure 7B:
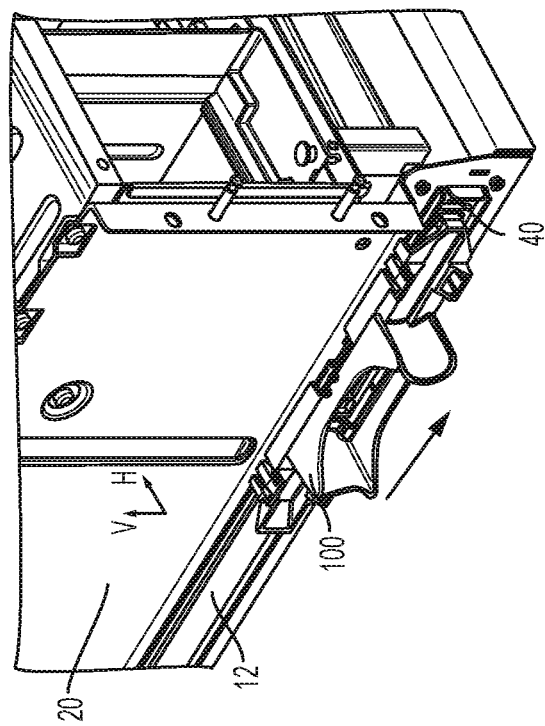
FIG. 7B is a perspective view of the rail clamp latch holder of FIG. 6 having been press-fit onto the rail of FIG. 5A in accordance with embodiments.
Figure 7A:
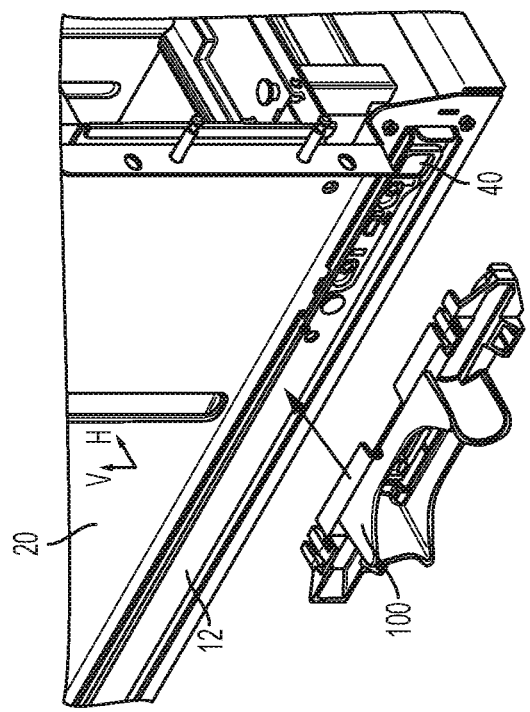
FIG. 7A is a perspective view of the rail clamp latch holder of FIG. 6 being press-fit onto the rail of FIG. 5A in accordance with embodiments.
Figure 8:
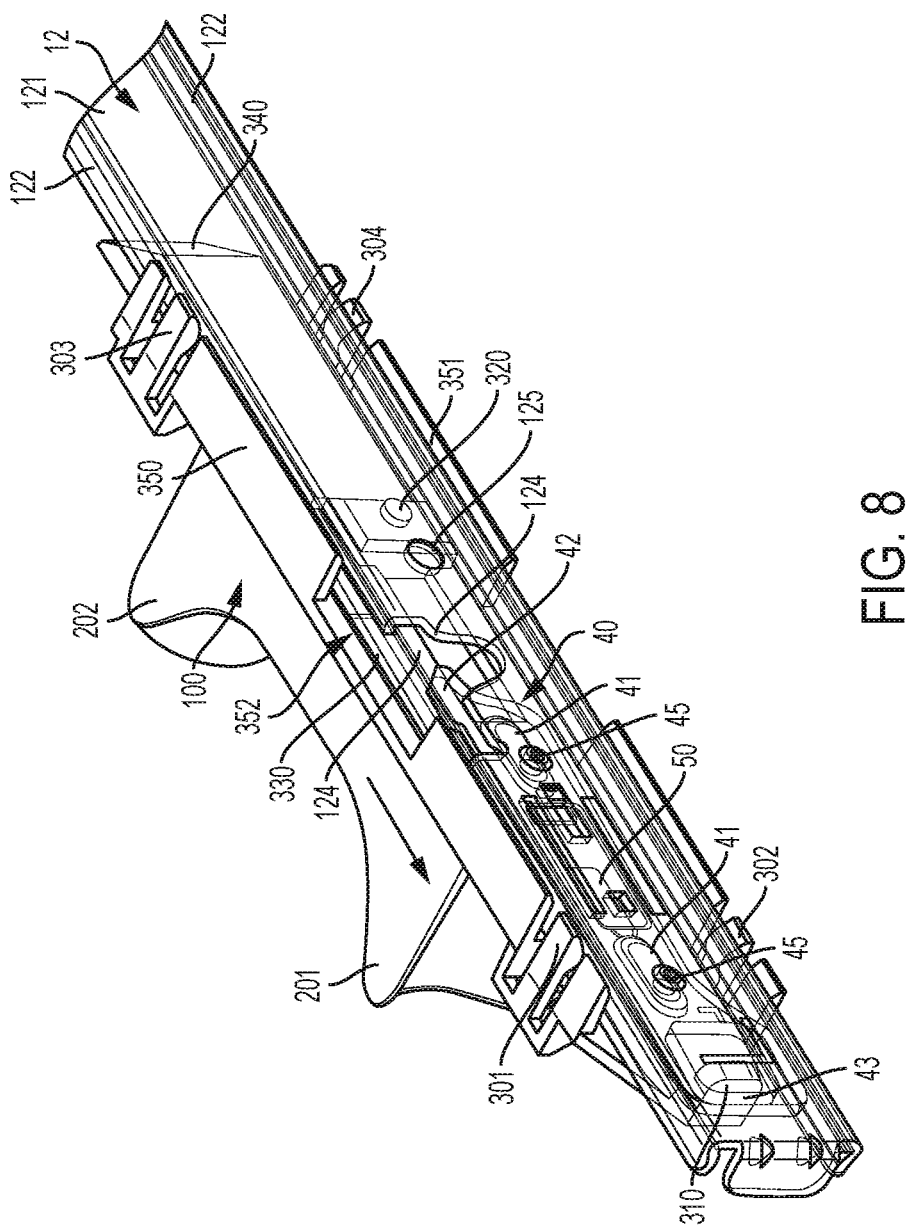
FIG. 8 is a cutaway view of the rail clamp latch holder of FIGS. 6, 7A and 7B having been press-fit onto the rail of FIG. 5A in accordance with embodiments.

With reference to FIGS. 7A, 7B and 8 and in accordance with embodiments, a distance between the tab 310 and the locking pin 320 is larger than a distance between the tab receiving portion 43 of the rail latch 40 and the rail through-hole 125 when the rail latch 40 assumes the closed position whereas the distance between the tab 310 and the locking pin 320 is substantially equal to the distance between the tab receiving portion 43 of the rail latch 40 and the rail through-hole 125 when the rail latch 40 assumes the open position. That is, as shown in FIG. 7A, when the rail clamp latch holder 100 is initially press-fit onto the rail 12, the rail latch 40 is normally disposed in the closed position due to the bias applied thereto by the elastic element 50. As such, as shown in FIG. 8, the tab 310 could be received in the tab receiving portion 43 but the locking pin 320 would be misaligned with respect to the rail through-hole 125. However, as shown in FIG. 7B, the rail clamp latch holder 100 is slid along the rail 12 and the rail latch 40 is correspondingly translated due to the interference between the tab 310 and the tab receiving portion 43, the locking pin 320 eventually aligns with the rail through-hole 125.

Once the locking pin 320 aligns with the rail through-hole 125, the elastic member 330 biases the locking pin 320 into the rail through-hole 125. This action in combination with the press-fitting of the first and second pairs of latches 301, 302, 303 and 304 with the opposed sidewalls 122, effectively locks the rail latch 40 in position. Further, the positioning of the various components described herein is such that, when the rail latch 40 is effectively locked in position, the rail latch 40 will have assumed and is thus maintained in the open position whereby movement of the boss 22 relative to the groove 124 is permitted. That is, the relative distances between the rail through-hole 125 and the tab receiving portion 43 when the rail latch 40 is disposed and maintained in the open position is large enough such that the locking portion 42 clears the groove 124 and the boss 22.

With reference back to FIGS. 1-4 and in accordance with embodiments, a number of rail clamp latch holders 100 is at least equal to a number of the bosses 22 and the rail latches 40 of the rail system 10. That is, if a given rail system 10 has two rails 12 with one rail latch 40 each, the rail system 10 will include at least two rail clamp latch holders 100. In such a case, each of the two rail clamp latch holders 100 will be applied to the rail latch 40 of each rail 12 during, for example, a given removal operation for a processor drawer 20.

Figure 9:
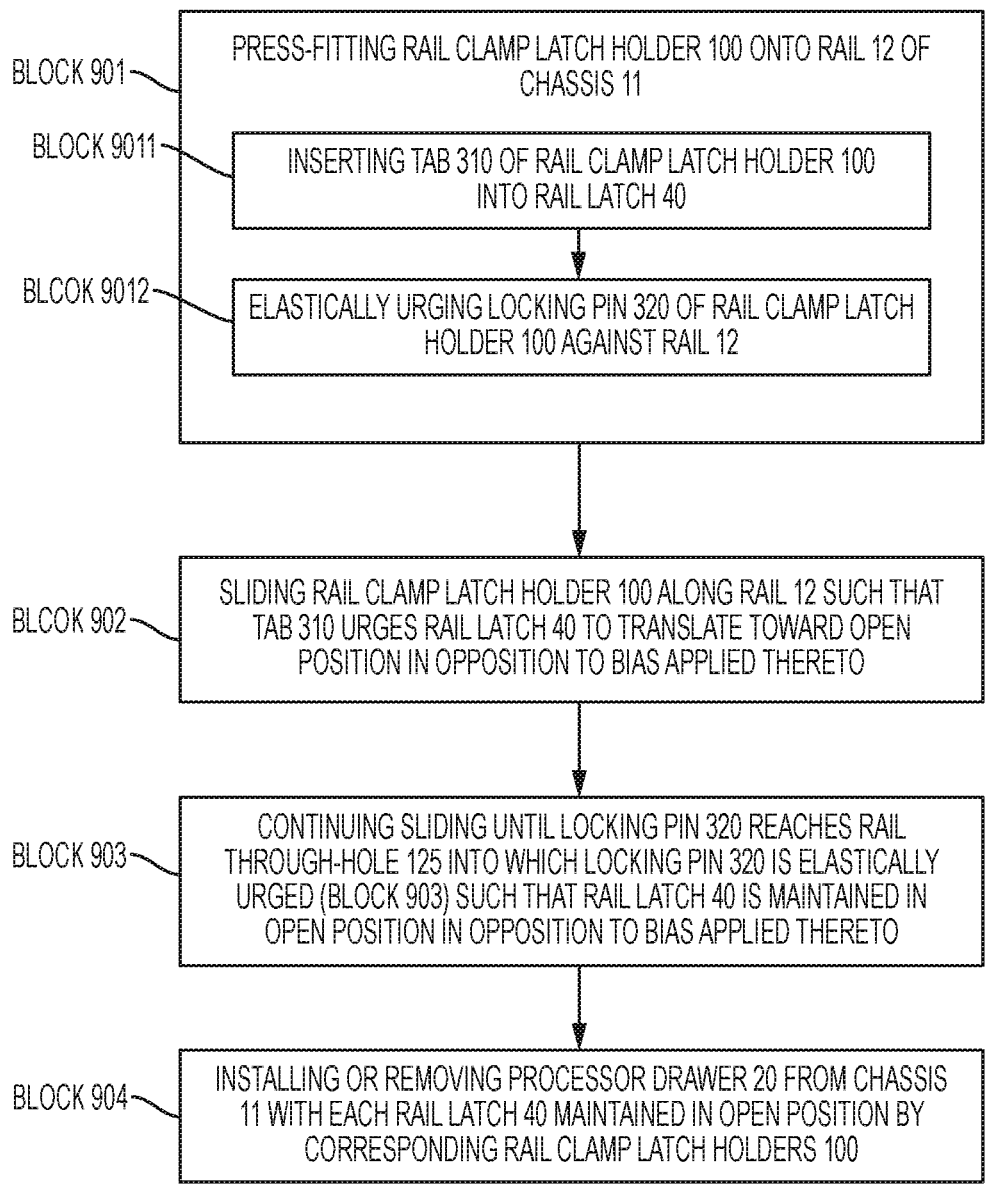
FIG. 9 is a flow diagram illustrating a processor drawer manipulation method in accordance with embodiments.

With reference back to FIGS. 1-4 and with additional reference to FIG. 9, a processor drawer manipulation method is provided for use in removing the processor drawer 20 from the interior space 110 of the chassis 11 or, in some cases, for use in installing the processor drawer 20 into the interior space 110 of the chassis 11. As shown in FIG. 9, the processor drawer manipulation method can include press-fitting the rail clamp latch holder 100 onto the rail 12 of a chassis 11 (block 901). The press-fitting of block 901 includes inserting the tab 310 of the rail clamp latch holder 100 into the rail latch 40 (block 9011) and elastically urging the locking pin 320 of the rail clamp latch holder 100 against the rail 12 (block 9012). The processor drawer manipulation method further includes sliding the rail clamp latch holder 100 along the rail 12 such that the tab 310 urges the rail latch 40 to translate toward the open position in opposition to the bias applied thereto (block 902) and continuing the sliding until the locking pin 320 reaches the rail through-hole 125 into which the locking pin 320 is elastically urged (block 903) such that the rail latch 40 is maintained in the open position in opposition to the bias applied thereto.

In accordance with embodiments, the processor drawer manipulation method can further include repeating the press-fitting of block 901, the sliding of block 902 and the continuing of the sliding of block 903 for each rail latch 40 of each rail 12. In addition, the processor drawer manipulation method can also include installing or removing the processor drawer 20 from the chassis 11 with each rail latch 40 of each rail 12 maintained in the open position by the corresponding rail clamp latch holders 100 (block 904).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A rail clamp latch holder, comprising:
   a grippable portion;
   a rail portion disposed at a forward side of the grippable portion and comprising:
   a latch configured to latch onto a rail and disposed at an end of the rail portion;
   a tab insertable into a rail latch;
   a locking pin; and
   an elastic member extending along the rail portion and elastically coupling the locking pin and the tab,
   wherein the rail portion comprises protective elements formed to define opposed slots.

2. The rail clamp latch holder according to claim 1, wherein the latch is press-fittable onto a rail sidewall.

3. The rail clamp latch holder according to claim 1, wherein the latch is configured to slide along a rail sidewall.

4. The rail clamp latch holder according to claim 1, wherein the tab and the locking pin are distant from one another.

5. The rail clamp latch holder according to claim 4, wherein the elastic member is configured to bias the locking pin.

6. The rail clamp latch holder according to claim 1, wherein the elastic member comprises a leaf spring.

7. The rail clamp latch holder according to claim 1, wherein:
   the rail portion comprises an angled surface, and
   the tab and the angled surface are disposed at ends of the rail portion, respectively.

8. A rail system, comprising:
   a processor drawer comprising bosses;
   a chassis defining a space into or from which the processor drawer comprising the bosses is installed or removed;
   rails coupled to the chassis, and each of said rails comprising:
   a body defining a groove into which a corresponding one of the bosses is receivable,
   a rail latch translatable relative to the body to assume and move between a closed position at which the rail latch prevents boss movement relative to the groove and an open position at which the rail latch permits boss movement relative to the groove, and
   an elastic element disposed to urge the rail latch toward the closed position; and
   at least one rail clamp latch holder which is attachable to each of the rails and configured to move and maintain a corresponding one of said rail latches into and in the open position,
   wherein the at least one rail clamp latch holder comprises:
   a grippable portion,
   a rail portion disposed at a forward side of the grippable portion and comprising pairs of opposed latches configured to latch onto each of the rails and disposed at ends of the rail portion, respectively,
   a tab which is insertable into one said rail latch,
   a locking pin which is receivable in a rail through-hole of the rail, and
   an elastic member which extends along the rail portion and elastically couples the locking pin and the tab.

9. The rail system according to claim 8, wherein the rails are extendable from the space.

10. The rail system according to claim 8, wherein:
    each of the rails comprises rail sidewalls; and
    the pairs of opposed latches are press-fittable onto and configured to slide along the rail sidewalls.

11. The rail system according to claim 10, wherein a distance between the tab and the locking pin is substantially equal to a distance between a tab receiving portion of the rail latch and the rail through-hole when the rail latch assumes the open position.

12. The rail system according to claim 11, wherein the elastic member is configured to bias the locking pin into the rail through-hole and comprises a leaf spring.

13. The rail system according to claim 10, wherein:
    the rail portion comprises an angled surface which is angled away from the rail, and
    the tab and the angled surface are disposed at the ends of the rail portion, respectively.

14. The rail system according to claim 8, wherein the rail portion comprises protective elements which are slidable along the rail and formed to define opposed slots.

15. The rail system according to claim 8, wherein a number of said at least one rail clamp latch holder is at least equal to a number of the bosses and the rail latches.

16. A processor drawer manipulation method, comprising:
press-fitting a rail clamp latch holder onto a rail of a chassis, wherein the press-fitting comprises:
inserting a tab of the rail clamp latch holder into a rail latch; and
urging a locking pin of the rail clamp latch holder against the rail;
sliding the rail clamp latch holder along the rail such that the tab urges the rail latch to translate in opposition to a bias applied thereto; and
continuing the sliding until the locking pin reaches a rail through-hole into which the locking pin is elastically urged such that a position of the rail latch is maintained in opposition to the bias.

17. The processor drawer manipulation method according to claim 16, wherein the press-fitting, the sliding and the continuing of the sliding is repeated.

18. The processor drawer manipulation method according to claim 17, further comprising installing or removing a processor drawer from the chassis.

\* \* \* \* \*